United States Patent
Chang et al.

(10) Patent No.: US 12,341,009 B2
(45) Date of Patent: Jun. 24, 2025

(54) VARIABLE HARDNESS AMORPHOUS CARBON MASK

(71) Applicant: Tokyo Electron Limited, Tokyo (JP)

(72) Inventors: Shihsheng Chang, Albany, NY (US); Andrew Metz, Albany, NY (US); Yun Han, Albany, NY (US); Ya-Ming Chen, Austin, TX (US); Kai-Hung Yu, Albany, NY (US); Eric Chih-Fang Liu, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 650 days.

(21) Appl. No.: 17/660,111

(22) Filed: Apr. 21, 2022

(65) Prior Publication Data
US 2023/0343592 A1 Oct. 26, 2023

(51) Int. Cl.
*H01L 21/033* (2006.01)
(52) U.S. Cl.
CPC .................. *H01L 21/0332* (2013.01)
(58) Field of Classification Search
CPC ........... H01L 21/0332; H01L 21/31144; H01L 21/02115; H01L 21/02274; C23C 14/0605; C23C 16/26; C23C 16/455525; C23C 16/50
USPC .................................................. 430/311, 313
See application file for complete search history.

(56) References Cited

U.S. PATENT DOCUMENTS

| | | | |
|---|---|---|---|
| 9,412,613 B2 | 8/2016 | Manna et al. | |
| 2003/0091938 A1* | 5/2003 | Fairbairn | H01L 21/022 |
| | | | 430/329 |
| 2007/0115589 A1* | 5/2007 | Huang | G11B 5/3169 |
| | | | 360/234.3 |

(Continued)

FOREIGN PATENT DOCUMENTS

| | | |
|---|---|---|
| JP | H11100294 A | 4/1999 |
| KR | 20080104902 A | 12/2008 |

(Continued)

OTHER PUBLICATIONS

International Searching Authority, "Notification of Transmittal of The International Search Report and The Written Opinion of The International Searching Authority, or The Declaration," International application No. PCT/US2023/017508, Aug. 16, 2023, 11 pages.

*Primary Examiner* — Caleen O Sullivan
(74) *Attorney, Agent, or Firm* — Slater Matsil, LLP (57) ABSTRACT

A method of fabricating an amorphous carbon layer (ACL) mask includes forming an ACL on an underlying layer. The ACL includes a soft ACL portion that has a first hardness and a hard ACL portion that has a second hardness. The soft ACL portion underlies the hard ACL portion. The second hardness is greater than the first hardness. The method further includes forming a patterned layer over the ACL and forming an ACL mask by etching through both the soft ACL portion and the hard ACL portion of the ACL to expose the underlying layer using the patterned layer as an etch mask. Forming the ACL may include depositing one or both of the (Continued)

soft ACL portion and the hard ACL portion. Processing conditions may also be varied while forming the ACL to create a hardness gradient that transitions from softer to harder.

20 Claims, 7 Drawing Sheets

(56) References Cited

U.S. PATENT DOCUMENTS

| | | | |
|---|---|---|---|
| 2013/0302996 A1* | 11/2013 | Reilly | H01L 21/02274 |
| | | | 438/758 |
| 2018/0337047 A1 | 11/2018 | Fung et al. | |
| 2021/0313166 A1 | 10/2021 | Wu et al. | |
| 2023/0223263 A1* | 7/2023 | Rigsby | C23C 16/56 |
| | | | 438/694 |

FOREIGN PATENT DOCUMENTS

| | | |
|---|---|---|
| KR | 101330516 B1 | 11/2013 |
| WO | 2012071163 A2 | 5/2012 |
| WO | 2021225790 A1 | 11/2021 |

\* cited by examiner

VARIABLE HARDNESS AMORPHOUS CARBON MASK

TECHNICAL FIELD

The present invention relates generally to etching processes, and, in particular embodiments, to variable hardness amorphous carbon masks and methods thereof.

BACKGROUND

Microelectronic device formation may involve a series of manufacturing techniques including formation, patterning, and removal of a number of layers of material on a substrate. Etch masks may be formed (e.g. deposited) to protect regions of the substrate and allow for pattern transfer via etching. Obtaining a high aspect ratio during etching is important for a variety of semiconductor processes such as during high aspect ratio contact (HARC) formation, NAND formation (e.g. 3D-NAND), NOR formation, memory formation, and others.

Distortion may occur when transferring a pattern to an underlying layer. For example, the features transferred to the underlying layer may have any number of undesirable defects such as broadening or narrowing, inconsistency in size or location, and non-vertical sidewalls. Twisting is one particular problem that involves a deviation from a desired vertical profile causing the feature to drift sideways. As the thickness of the underlying layer increases, twisting may become more and more pronounced. Therefore, it may be desirable to have etch masks with improved profile control while maintaining desired mask thickness and throughput.

SUMMARY

In accordance with an embodiment of the invention, a method of fabricating an amorphous carbon layer (ACL) mask includes forming an ACL on an underlying layer. The ACL includes a soft ACL portion that has a first hardness and a hard ACL portion that has a second hardness. The soft ACL portion underlies the hard ACL portion. The second hardness is greater than the first hardness. The method further includes forming a patterned layer over the ACL and forming an ACL mask by etching through both the soft ACL portion and the hard ACL portion of the ACL to expose the underlying layer using the patterned layer as an etch mask.

In accordance with another embodiment of the invention, a method of fabricating an ACL mask includes depositing a soft ACL layer of a multilayer ACL stack on an underlying layer and depositing a hard ACL layer of the multilayer ACL stack over the soft ACL layer. The soft ACL layer has a first hardness that is less than 10 GPa and a first thickness of at least 0.5 μm. The hard ACL layer has a second hardness greater than or equal to 10 GPa. The method further includes forming a patterned layer over the multilayer ACL stack and forming an ACL mask by etching through the multilayer ACL stack to expose the underlying layer using the patterned layer as an etch mask.

In accordance with still another embodiment of the invention, an ACL mask includes a soft ACL layer, a hard ACL layer disposed over the soft ACL layer, and a high aspect ratio pattern extending through both the soft ACL layer and the hard ACL layer. The soft ACL layer is at least 0.5 μm thick and includes a first hardness. The hard ACL layer is at least 0.5 μm thick and includes a second hardness that is greater than the first hardness.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a mask layer with vertical features and FIG. 1B illustrates a mask layer with distorted features;

FIG. 6A shows the formation of a soft ACL layer, FIG. 6B shows the formation of a hard ACL layer, FIG. 6C shows the formation of a patterned layer, FIG. 6D shows the formation of an ACL mask, FIG. 6E shows the etching of an underlying layer, and FIG. 6F shows the pattern transferred to the underlying layer;

FIG. 7A shows the formation of a soft ACL portion of an ACL, FIG. 7B shows the formation of a hard ACL portion of the ACL, and FIG. 7C shows the formation of the ACL mask.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Amorphous carbon masks are useful for etching an underlying layer of a workpiece, such as during microelectronic device formation. In particular, hard amorphous carbon layer (ACL) masks may be used for high aspect ratio processes such as in HARC processes. For example, high aspect ratio processes may be used during memory fabrication, including dynamic random access memory (DRAM), NAND flash, NOR flash, and the like. During the etching process, the pattern of a hard ACL mask may be transferred to an underlying layer (e.g. a dielectric layer or layers including oxide, nitride, etc.). Etching contact holes is one specific application of such a high aspect ratio etching of an ACL hard mask.

A few micrometers of amorphous carbon is often used as a hard mask during device formation (e.g. 3D-NAND devices) for dielectric (e.g. oxide, nitride, ONO) open because of its good etch selectivity to dielectrics. The opening of a thick ACL layer may take a long time due to the high aspect ratio. The etching may take place in a plasma processing chamber, such as an inductively coupled plasma (ICP) chamber, for example.

Amorphous carbon with higher hardness (i.e. hard ACL) may be used for etching processes such as for etching dielectric because of better etch selectivity than amorphous carbon with lower hardness (i.e. soft ACL). Hardness may be increased of during hard ACL formation by increasing the temperature. For this reason, hard ACL may also be referred to as high-temp ACL (although high temperature is not the only factor determining the hardness of an ACL). One example of high-temp ACL is the APF® family of films available from Applied Materials. Since temperature affects the hardness of the ACL, temperature and other variables may be controlled to form ACL with different properties. For example, low-temp ACL (e.g. formed at 450° C.) may result in soft ACL.

Yet, although hard ACL is more resistant to etching than soft ACL, it is also much harder to open and can suffer profile distortion at high aspect ratios. For example, when etching hard ACL, twisting (which may refer to the bending of a feature from the desired vertical etch profile) may begin at or even before the relatively shallow depth of 1.5 µm. This correlates with what may be considered moderate aspect ratio. Additionally, the effects of twisting compound as the etch depth is increased, making profile distortion in hard ACL even more pronounced for high aspect ratio processes. In many cases the hard ACL mask must be much thicker than 1.5 µm in order to ensure that the ACL is not fully consumed during the etch.

Simply continuing to increase the hardness of the ACL could further improve selectivity so that a thinner mask could be used. However, increased hardness also increases the time to open and causes distortion to occur even sooner rendering such a solution infeasible. Additionally, it may be undesirable to alter the thickness of the mask for a variety of reasons. There may also be practical limitations (e.g. difficulty, cost, diminishing returns) to increasing the hardness of the ACL past a certain point.

In contrast, soft ACL may be easier to open and attain a better profile, while having reduced etch resistance (e.g. during dielectric open) compared with harder ACL. The onset of distortion such as twisting in soft ACL may be at much greater depth, such as at 2.5 µm or more. Therefore, even mild profile distortion may not begin to occur for soft ACL until well into the high aspect ratio range. However, by itself, soft ACL would need to be much too thick for high aspect ratio etches due to its lower selectivity.

In various embodiments, an ACL mask includes a soft ACL portion and a hard ACL portion. The hard ACL portion is located at an upper portion of the ACL mask and has a higher hardness than the soft ACL portion. A pattern for transferring to an underlying layer extends through the hard ACL portion and the soft ACL portion of the ACL mask. The ACL mask may be fabricated by forming a patterned layer overlying the ACL mask and etching through both the soft ACL portion and the hard ACL portion using the patterned layer as an etch mask.

The embodiment ACL masks described herein advantageously combine the benefits of both soft ACL and hard ACL to improve profile distortion and throughput while maintaining high etch selectivity. It is desirable to both control the etch profile and maintain high etch selectivity. The proposed approach utilizes at least two ACL portions of different hardness in a single ACL mask with a harder ACL portion located above a softer ACL portion. By replacing a uniform ACL with a variable hardness ACL, the low to moderate aspect ratio portions of a high aspect ratio etch may advantageously utilize the harder ACL while the moderate to high aspect ratio portions utilize the softer ACL. In this way, etching the ACL becomes easier (i.e. faster and with less distortion) when transitioning to high aspect ratio.

Another potential benefit of the embodiment ACL masks is to advantageously allow the thickness of the ACL mask to be controlled. In particular, using a hard ACL portion located above a soft ACL portion may advantageously allow the thickness of the ACL mask to remain the same while achieving improved profile control and throughput. The variable hardness of the embodiment ACL masks may facilitate optimization of mask thickness, throughput, and profile distortion. Even with the soft ACL portion at the lower portion of the ACL mask, etching performance may not be degraded because a sufficient amount of ACL may be remaining post etch. Though careful design and optimization, this remaining ACL can advantageously be mainly soft ACL. That is, the hard ACL portion may act as protection against etching in the beginning of the etch and the soft ACL portion may act as the etch protection at the end of the etch.

Figure 1A:
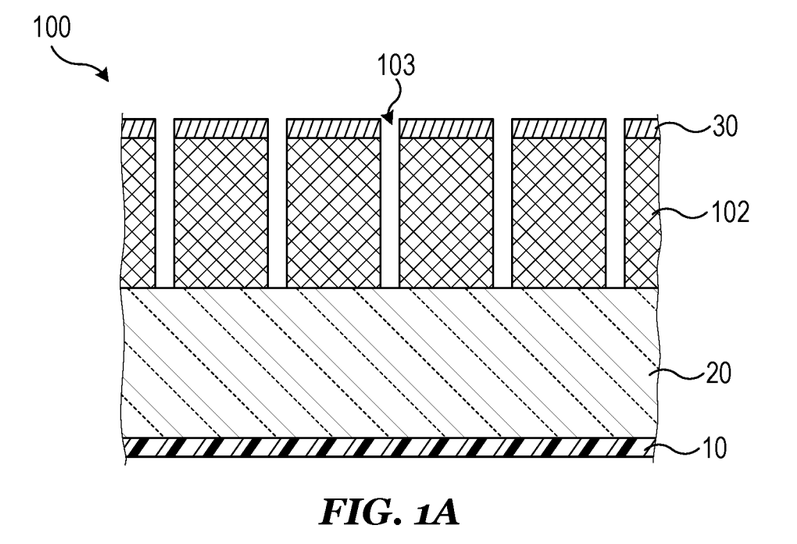
FIGS. 1A and 1B illustrate cross-sectional views of example mask layers in accordance with embodiments of the invention where
Figure 1B:
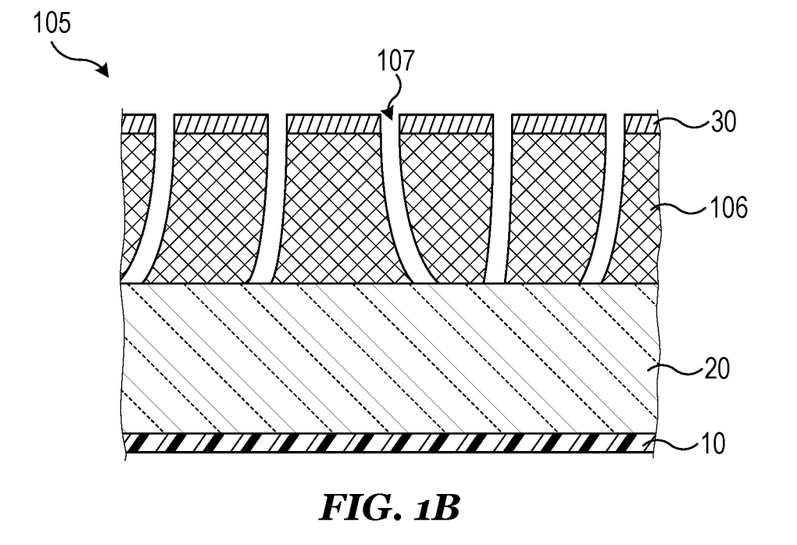

Embodiments provided below describe various etching processes and structures, and in particular, etching processes and structures that include variable hardness amorphous carbon masks. The following description describes the embodiments. FIGS. 1A and 1B are used to describe and example of profile distortion. An embodiment ACL mask is described using FIG. 2. Three more embodiment ACL masks are described using FIGS. 3-5. An embodiment etching process is described using FIGS. 6A-6F. Another embodiment etching process is described using FIGS. 7A-7C. An embodiment method of fabricating an ACL mask is described using FIG. 8.

FIGS. 1A and 1B illustrate cross-sectional views of example mask layers in accordance with embodiments of the invention where FIG. 1A illustrates a mask layer with vertical features and FIG. 1B illustrates a mask layer with distorted features.

Referring to FIG. 1, a workpiece 100 includes an underlying layer 20 supported by a substrate 10. In some cases, the underlying layer 20 may be the substrate, and other additional layers may of course be included. A mask layer 102 (e.g. a hard mask layer) is disposed on the underlying layer 20. The mask layer 102 is shown here to have vertical features 103. That is, the features of a patterned layer 30 disposed over the mask layer 102 are accurately transferred to the mask layer 102 as vertical features.

In contrast, a workpiece 105 includes a mask layer 106 that experience distortion (e.g. twisting as illustrated) during transfer of the features from the patterned layer 30 to the mask layer 106. The result is distorted features 107 which to do not accurately reflect the desired positioning of the features of the patterned layer 30. This undesirable distortion may occur for a number of reasons, such as increased mask thickness or increased mask hardness, as discussed above.

In particular, distortion may be more likely to occur at higher aspect ratios. Etch depth that is less than 1.5 µm may be considered low aspect ratio while greater than 1.5 µm may be considered moderate to high aspect ratio. In the specific example of hard amorphous carbon masks (e.g. used for high aspect ratio dielectric etches), undesirable levels of distortion may occur at moderate to high aspect ratios (e.g. greater than or equal to 1.5 µm). Since etch depths greater than 1.5 µm are frequently sought, strategies to mitigate distortion in high aspect ratio etches may be desirable. The following description describes in detail various techniques that enable the features transferred from a patterned layer to a mask layer to approximate the ideal vertical features 103 of mask layer 102 rather than the distorted features 107 of mask layer 106.

Figure 2:
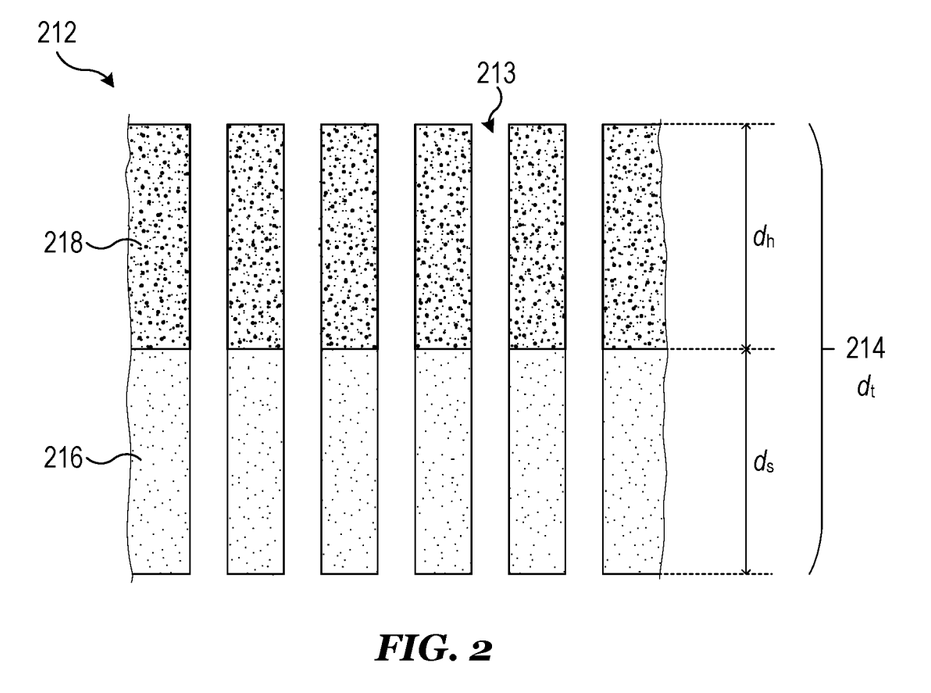
FIG. 2 illustrates a cross-sectional view of an example amorphous carbon layer (ACL) mask that includes a soft ACL portion and a hard ACL portion in accordance with embodiments of the invention.

FIG. 2 illustrates a cross-sectional view of an example ACL mask that includes a soft ACL portion and a hard ACL portion in accordance with embodiments of the invention. Similarly labeled elements may be as previously described.

Referring to FIG. 2, an ACL mask 212 includes an ACL 214 comprising a soft ACL portion 216 and a hard ACL portion 218. The hard ACL portion 218 is harder than the soft ACL portion 216 and overlies the soft ACL portion 216. For example, the soft ACL portion 216 may have a hardness $H_s$ while the hard ACL portion 218 has a hardness $H_h$ that is greater than $H_s$. A high aspect ratio pattern 213 extends through both the hard ACL portion 218 and the soft ACL portion 216.

The soft ACL portion 216 also has a thickness $d_s$ and the hard ACL portion 218 has a thickness $d_h$. In one embodiment, $d_s$ is about equal to $d_h$. In another embodiment, $d_s$ is greater than $d_h$. For example, it may be advantageous to reduce the thickness $d_h$ of the hard ACL portion 218 to increase throughput and mitigate profile distortion. However, in some cases the reverse might be true if, for example, higher selectivity is desired to reduce the overall thickness $d_t$ (i.e. $d_s+d_h$) of the ACL 214 and consequently the ACL mask 212.

In some embodiments, $d_s$ is at least 0.5 µm and is $d_s$ is at least 1 µm in various embodiments. In one embodiment, $d_s$ is less than about 3 µm. Similarly, in some embodiments, $d_h$ is at least 0.5 µm and is $d_h$ is at least 1 µm in various embodiments. In one embodiment, $d_h$ is less than about 2 µm and is less than 1.5 µm in another embodiment. In various embodiments, $d_t$ is at least 1 µm and is at least 2 µm in one embodiment. In one embodiment, $d_t$ is less than about 4 µm. However, these ranges are merely examples reflective of a variety of potential considerations. The concepts described herein also apply to other thicknesses depending on the specifics of a given application.

One or both of the soft ACL portion 216 and the hard ACL portion 218 may be implemented as a layer (e.g. a lower layer and an upper layer respectively). In particular, as illustrated, there the soft ACL portion 216 may have substantially uniform hardness over the thickness $d_s$ and have a definable boundary separating it from the hard ACL portion 218. For example, the ACL 214 may be a multilayer ACL stack (i.e. at least 2 layers) with the hardest ACL layer at the top of the ACL mask 212. However, uniformity is not a requirement. For example, in some embodiments, some or all of the ACL 214 may incorporate a gradient hardness transition, as will be explained in more detail below.

The ACL may be formed using any suitable process, such as plasma enhanced chemical vapor deposition (PECVD), as one example. Other methods are also possible, however, including electron cyclotron resonance (ECR), reactive sputtering, electron cyclotron wave resonance (ECWR), plasma beam source (PBS), filtered cathodic vacuum arc (FCVA), and the like.

Properties of the ACL, such as hardness, may be controlled during the ACL formation process. Temperature during ACL formation is one way to distinguish between soft ACL and hard ACL. For example, soft ACL (low-temp ACL) may be formed at a lower temperature than hard ACL (high-temp ACL) such as 450° C. However, temperature is not the only variable that affects hardness of an ACL. Therefore, it may be possible to form hard ACL at a "low" temperature and a soft ACL at a "high" temperature by altering other process conditions.

Hard ACL may have specific physical properties that differentiate it from soft ACL. These differentiating properties may include atomic percentage of $sp^3$ bonded carbon, atomic percentage of hydrogen, density, and (of course) hardness. For instance, hard ACL may have less than about 40% $sp^3$-bonded carbon, about 20%-40% hydrogen, and have a density in the range of about 1.6-2.2 g/cm$^3$. The resulting hardness $H_h$ may be greater than 10 GPa and is in the range of about 10 GPa-20 GPa in one embodiment. In one embodiment, the hard ACL is a tetrahedral amorphous carbon layer (ta-C:H) and exhibits even higher hardness ($H_h$ of up to 50 GPa)

In contrast, soft ACL may include at least 60% $sp^3$-bonded carbon (e.g. up to 70%), about 40%-50% hydrogen, and have a density in the range of about 1.2-1.6 g/cm$^3$. The hardness $H_s$ of the soft ACL is correspondingly lower than $H_h$. For example, the hardness $H_s$ of the soft ACL may be less than about 10 GPa.

Figure 3:
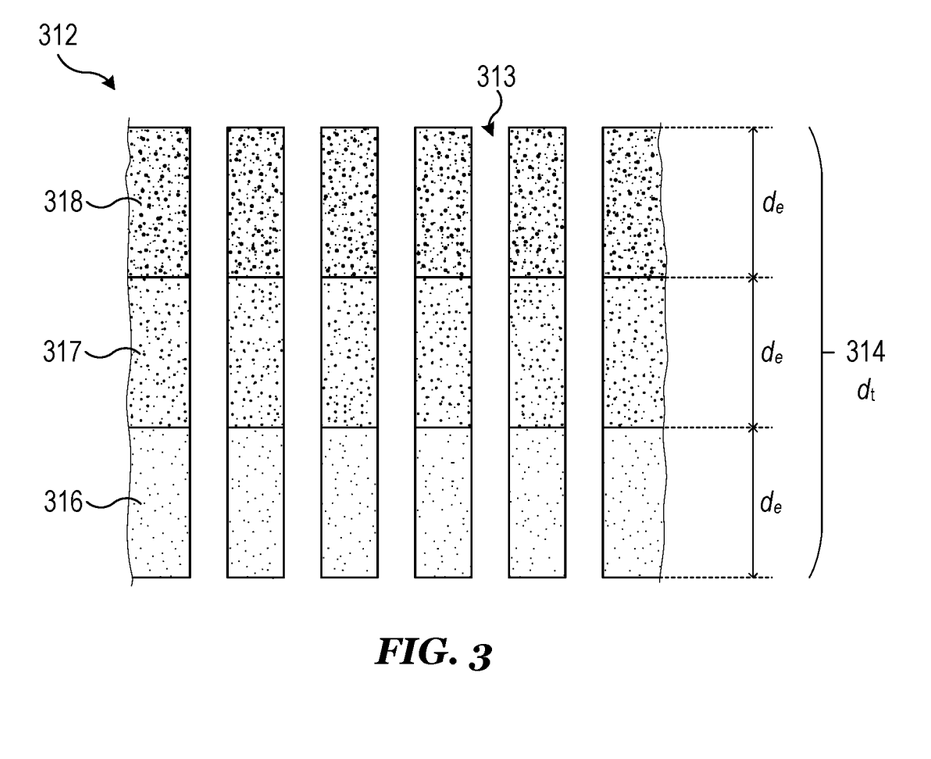
FIG. 3 illustrates a cross-sectional view of an example ACL mask that includes an intermediate ACL layer in accordance with embodiments of the invention.

FIG. 3 illustrates a cross-sectional view of an example ACL mask that includes an intermediate ACL layer in accordance with embodiments of the invention. The ACL mask of FIG. 3 may be a specific implementation of other ACL masks described herein such as the ACL mask of FIG. 2, for example. Similarly labeled elements may be as previously described.

Referring to FIG. 3, an ACL mask 312 includes an ACL 314 comprising a soft ACL portion 316 and a hard ACL portion 318 implemented as a soft ACL layer and a hard AC layer. It should be noted that here and in the following a convention has been adopted for brevity and clarity wherein elements adhering to the pattern [x12] may be related implementations of an ACL mask in various embodiments. For example, the ACL mask 312 may be similar to the ACL mask 212 except as otherwise stated. An analogous convention has also been adopted for other elements as made clear by the use of similar terms in conjunction with the aforementioned three-digit numbering system.

The ACL mask 312 is a specific implementation which an intermediate ACL layer 317 is included between the hard ACL portion 318 and the soft ACL portion 316. A high aspect ratio pattern 313 extends through the hard ACL portion 318, the intermediate ACL layer 317, and the soft ACL portion 316. The intermediate ACL layer 317 has a hardness $H_i$ that is greater than $H_s$ and less than $H_h$. The intermediate ACL layer 317 also has a thickness $d_i$. The thickness $d_i$ of the intermediate ACL layer 317 may be any suitable thickness and may depend on the specifics of a given application. In various embodiments, the overall thickness $d_t$ of the ACL mask 312 is maintained in the previous described ranges while $d_s$, $d_i$, and $d_h$ (as well as the hardness of the respective layers) are chosen to suit desired parameters.

Figure 4:
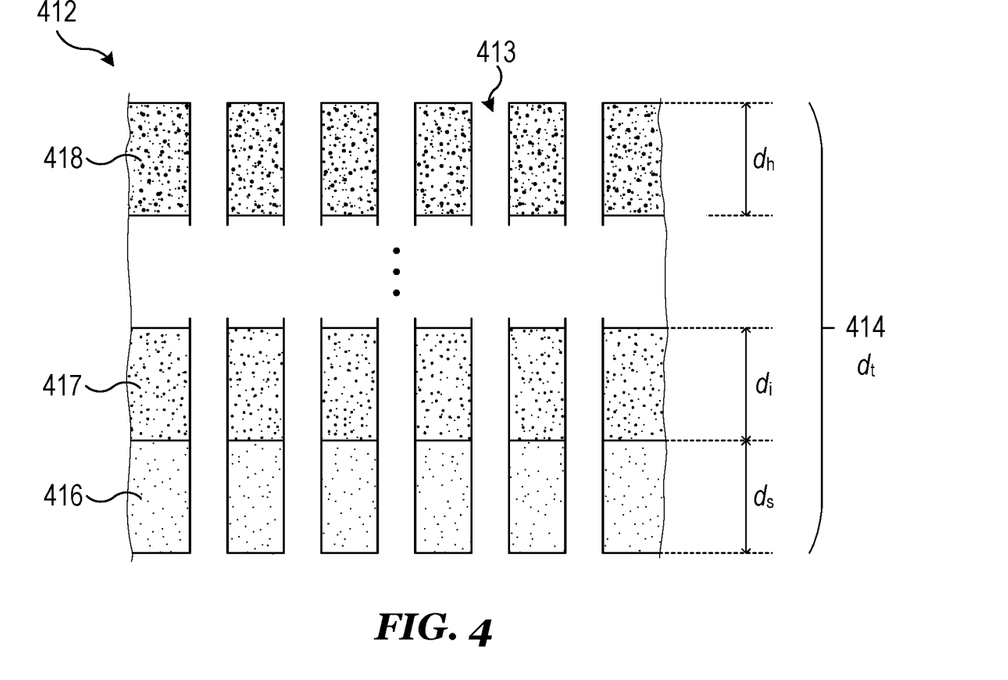
FIG. 4 illustrates a cross-sectional view of an example ACL mask that includes at least one intermediate ACL layer in accordance with embodiments of the invention.

FIG. 4 illustrates a cross-sectional view of an example ACL mask that includes at least one intermediate ACL layer in accordance with embodiments of the invention. The ACL mask of FIG. 4 may be a specific implementation of other ACL masks described herein such as the ACL mask of FIG. 2, for example. Similarly labeled elements may be as previously described.

Referring to FIG. 4, an ACL mask 412 includes an ACL 414 comprising a soft ACL portion 416 and a hard ACL portion 418 (implemented as a soft ACL layer and a hard AC layer, as shown). The ACL mask 412 is a generalized version of ACL mask 312 in that, in addition to an intermediate ACL layer 417, any suitable number of additional intermediate ACL layers may be included each with appropriate hardness between $H_s$ and $H_h$. A high aspect ratio pattern 413 extends through the hard ACL portion 418, all of the included intermediate ACL layers 417, and the soft ACL portion 416. As before, the overall thickness $d_t$ of the ACL mask 412 may be maintained in the previous described ranges while choosing the thicknesses of the ACL layers as desired.

Figure 5:
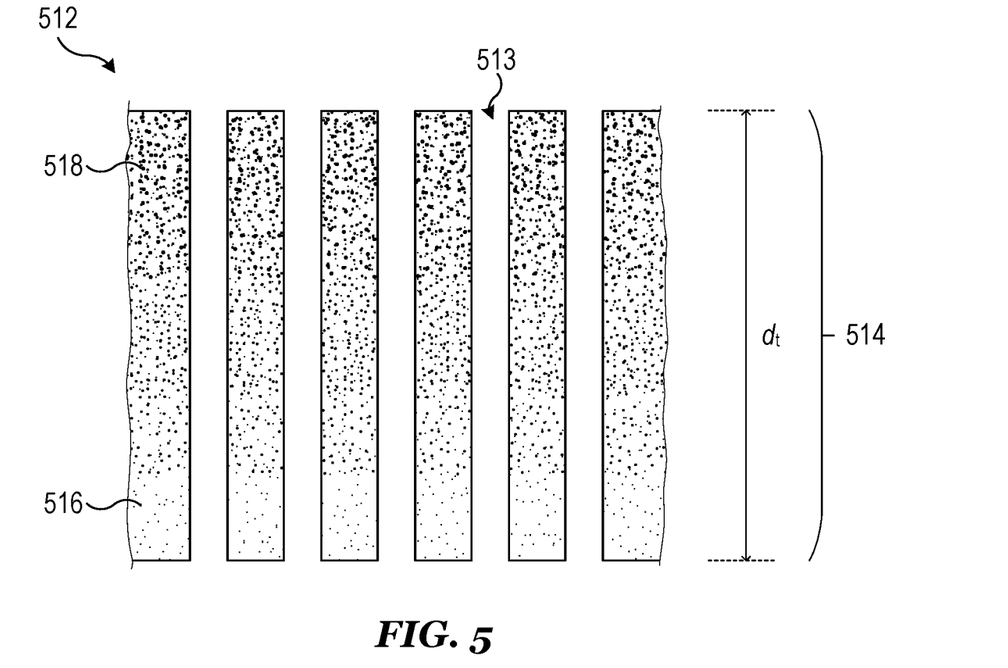
FIG. 5 illustrates a cross-sectional view of an example ACL mask that includes a gradient transition from a soft ACL portion to a hard ACL portion in accordance with embodiments of the invention.

FIG. 5 illustrates a cross-sectional view of an example ACL mask that includes a gradient transition from a soft ACL portion to a hard ACL portion in accordance with embodiments of the invention. The ACL mask of FIG. 5 may be a specific implementation of other ACL masks described herein such as the ACL mask of FIG. 2, for example. Similarly labeled elements may be as previously described.

Referring to FIG. 5, an ACL mask 512 includes an ACL 514 comprising a soft ACL portion 516 and a hard ACL portion 518. The ACL mask 512 is conceptually an even more generalized version of ACL mask 412 that is implemented without definable layers. Rather, ACL mask 512 includes a gradient hardness transition from the soft ACL portion 516 to the hard ACL portion 518. A high aspect ratio pattern 513 extends through the hard ACL portion 518 and the gradient to the soft ACL portion 516. The overall thickness $d_t$ of the ACL mask 512 may be the previous described ranges. Various properties of the ACL mask 512 may be advantageously controlled by choosing appropriate hardness transition profiles (e.g. linear or otherwise).

Figure 6A:
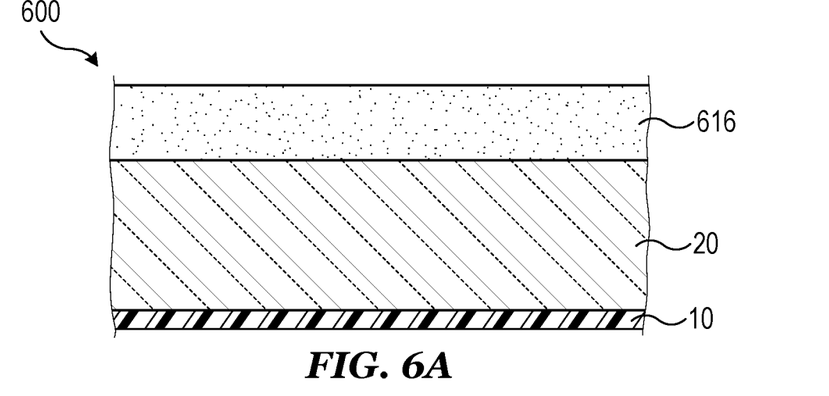
FIGS. 6A-6F illustrate cross-sectional views of an example workpiece during an etching process of an underlying layer using an ACL mask in accordance with embodiments of the invention, where
Figure 6B:
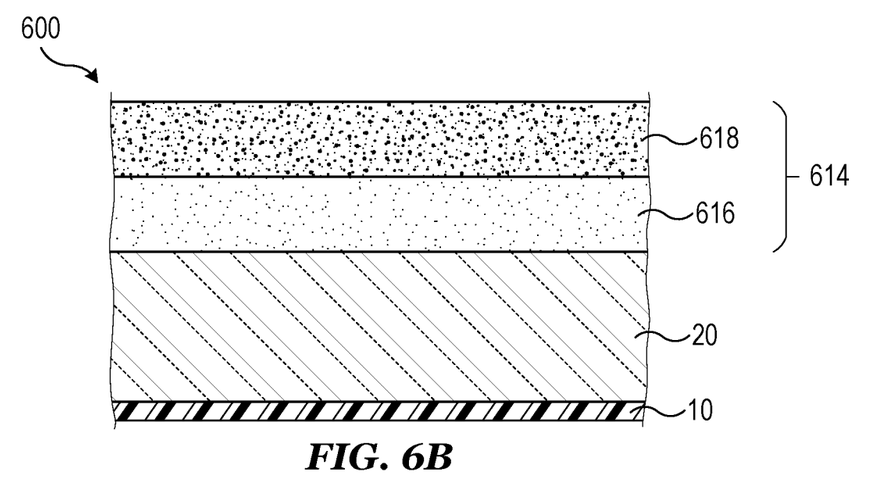
Figure 6C:
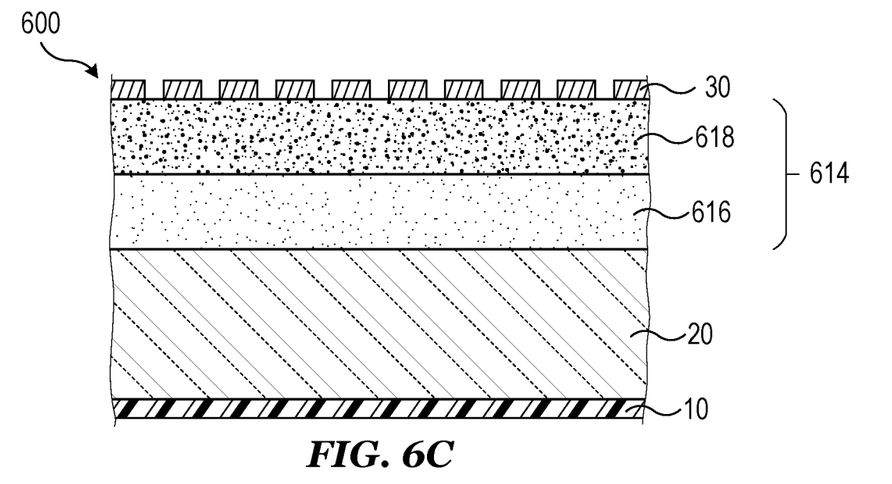
Figure 6D:
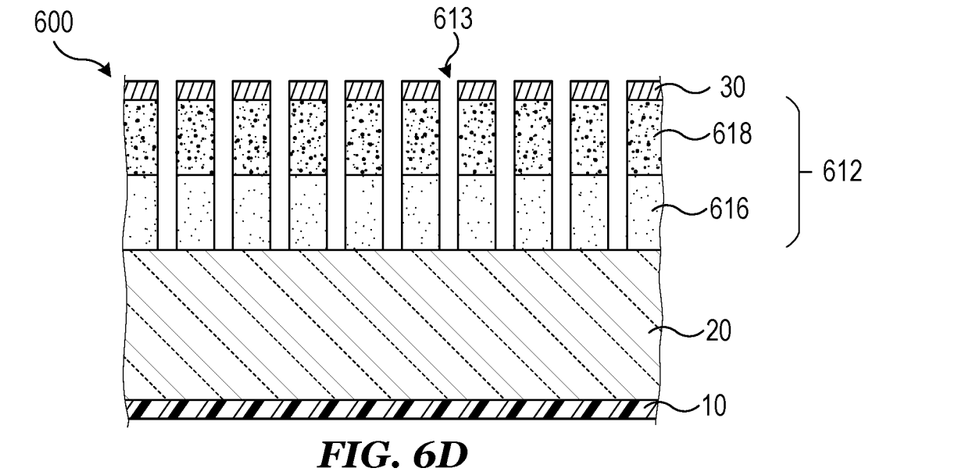
Figure 6E:
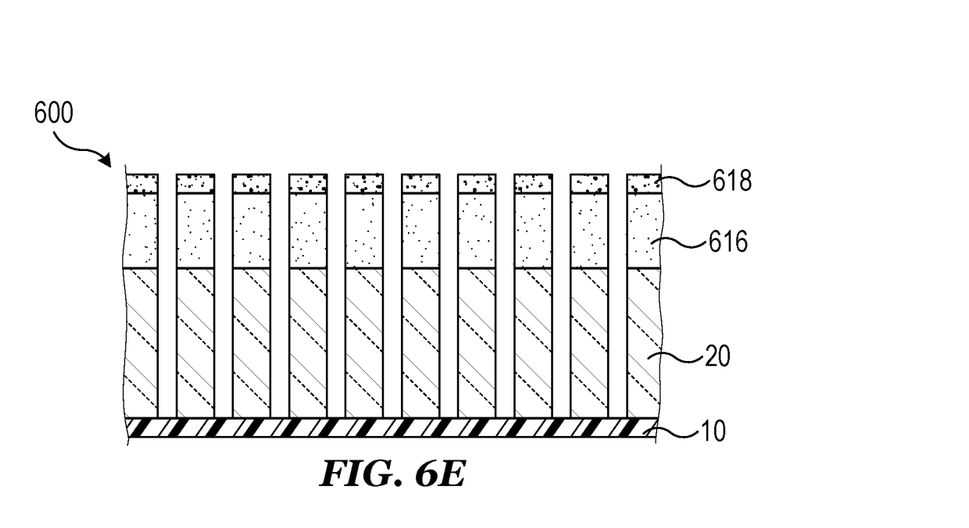
Figure 6F:
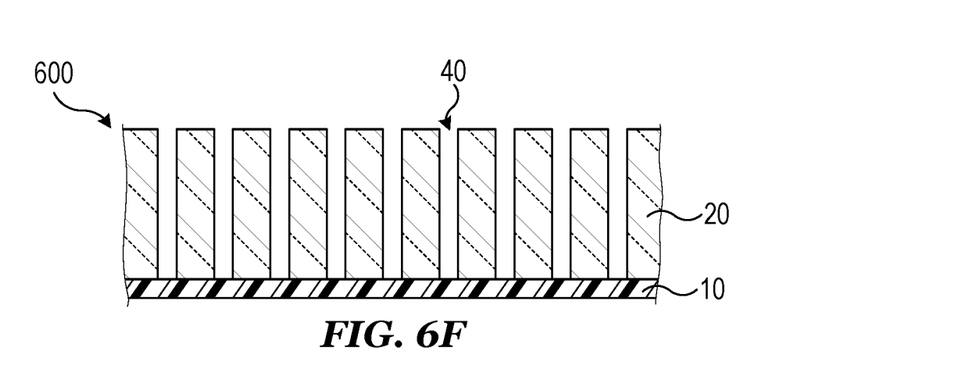

FIGS. 6A-6F illustrate cross-sectional views of an example workpiece during an etching process of an underlying layer using an ACL mask in accordance with embodiments of the invention, where FIG. 6A shows the formation of a soft ACL layer, FIG. 6B shows the formation of a hard ACL layer, FIG. 6C shows the formation of a patterned layer, FIG. 6D shows the formation of an ACL mask, FIG. 6E shows the etching of an underlying layer, and FIG. 6F shows the pattern transferred to the underlying layer. The etching process of FIG. 6A-6F may be combined with other methods and performed using the systems and apparatuses as described herein. For example, the etching process of FIGS. 6A-6F may be combined with any of the embodiments of FIGS. 1A-5, 7A-7C, and 8. Similarly labeled elements may be as previously described.

Referring to FIGS. 6A, a workpiece 600 includes an underlying layer 20 which may be supported by a substrate 10. In some cases, the underlying layer 20 may be the substrate 10 rather than being a separately defined layer. The substrate 10 may be any suitable substrate, such as a semiconductor substrate, metal substrate, insulating substrate, and the like. The underlying layer 20 may be any layer that exhibits sufficient etch selectivity for a given process relative to amorphous carbon.

In various embodiments, the underlying layer 20 comprises a dielectric. In one embodiment, the underlying layer 20 comprises an oxide. In one embodiment, the underlying layer 20 comprises a nitride. For example, the underlying layer 20 may be an oxide, a nitride, and oxynitride, or various combinations thereof, among other possibilities. In one specific example, the underlying layer 20 is a oxide-nitride-oxide stack (ONO) which m ay have any suitable number of layers. In another embodiment, the underlying layer 20 comprises polysilicon.

A soft ACL layer 616 is formed on the underlying layer 20 as shown in FIG. 6A. The soft ACL layer 616 may be formed using any suitable process and is deposited using PECVD in one embodiment. The hardness $H_s$ of the soft ACL layer 616 may be controlled by choosing specific values of various parameters such as temperature, hydrogen content, bias voltage, and pressure, among others. In one embodiment, $H_s$ is less than 10 GPa. The thickness $d_s$ of the soft ACL layer 616 may be at least 0.5 μm.

A hard ACL layer 618 is formed overlying the soft ACL layer 616 as shown in FIG. 6B. The combination of the soft ACL layer 616 and the hard ACL layer 618 is a multilayer ACL stack 614 which is disposed on the underlying layer 20. The hardness $H_h$ of the hard ACL layer 618 is similarly controlled during formation and it greater than $H_s$. In one embodiment, $H_h$ is greater than 10 GPa.

Additional intermediate layers of intermediate hardness $H_i$ may also be formed before forming the hard ACL layer 618 in some embodiments. That is, forming the multilayer ACL stack 614 may further include depositing an intermediate ACL layer on the lower layer (soft ACL layer 616) before depositing the hard ACL layer 618. The intermediate ACL layer(s) may have a hardness H; greater than the $H_s$ and less than $H_h$.

A patterned layer 30 (which may include a resist and can also use multiple layers to define the feature, for example, PR/SiARC/ODL/SiON, PR: 15-60 nm, SiARC: 20-40 nm, ODL: 200-400 nm, SiON: 135-340 nm) is formed on the hard ACL layer 618 of the multilayer ACL stack 614 as illustrated in FIG. 6C. The pattern of the patterned layer 30 is transferred to the multilayer ACL stack 614 using an etching process (e.g. a high aspect ratio process) to form an ACL mask 612 with high aspect ratio features 613 (FIG. 6D). The ACL plasma etching chemistry may include oxygen-containing (such as $O_2$) and/or sulfur-containing (such as $SO_2$ or COS) gases. The patterned layer 30 is then subsequently removed.

The ACL mask 612 is used as an etch mask to transfer the high aspect ratio features 613 to the underlying layer 20 as shown in FIG. 6E. The hard ACL layer 618 is consumed slowly during the etching of the underlying layer 20. In some embodiments, some of the hard ACL layer 618 may remain after the underlying layer 20 is opened as illustrative. However, in other embodiments, the soft ACL layer 616 (and any other potential intervening layers) may also be partially consumed during the etching of the underlying layer 20. Notably, some of the soft ACL layer 616 (or portion for gradient embodiments) remains after the etching so that integrity of the underlying layer 20 is advantageously maintained.

The ACL layers (including the soft ACL layer 616, the hard ACL layer 618, and any other ACL layers of the ACL mask 612) are advantageously removable after the etching of the underlying layer 20. For example, the ACL mask 612 may be ashable facilitating its removal. The end result, illustrated in FIG. 6F, is a transferred pattern 40 that reflects the desired position and profile of the patterned layer 30 by advantageously reducing distortion in the ACL mask 612.

Figure 7A:
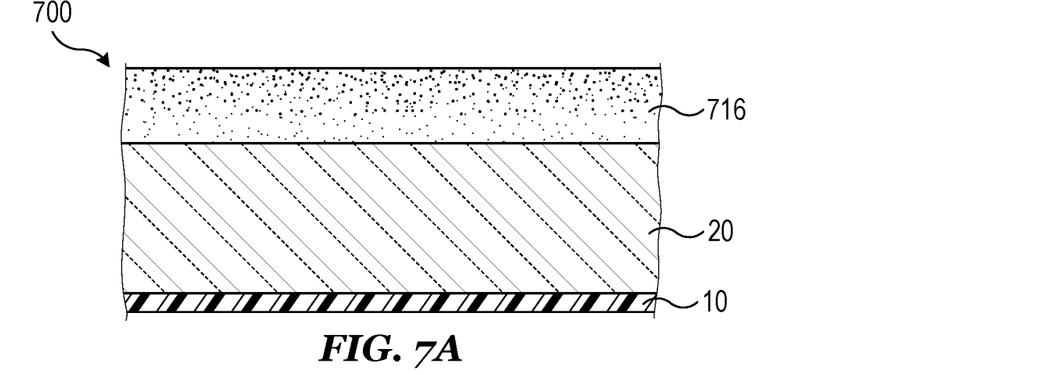
FIGS. 7A-7C illustrate cross-sectional views of an example workpiece during another etching process of an underlying layer using an ACL mask in accordance with embodiments of the invention, where
Figure 7B:
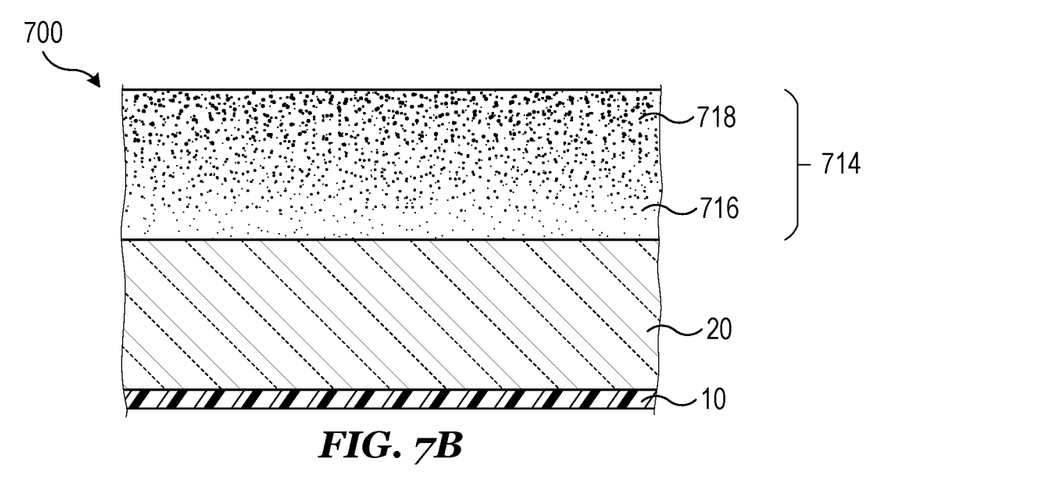
Figure 7C:
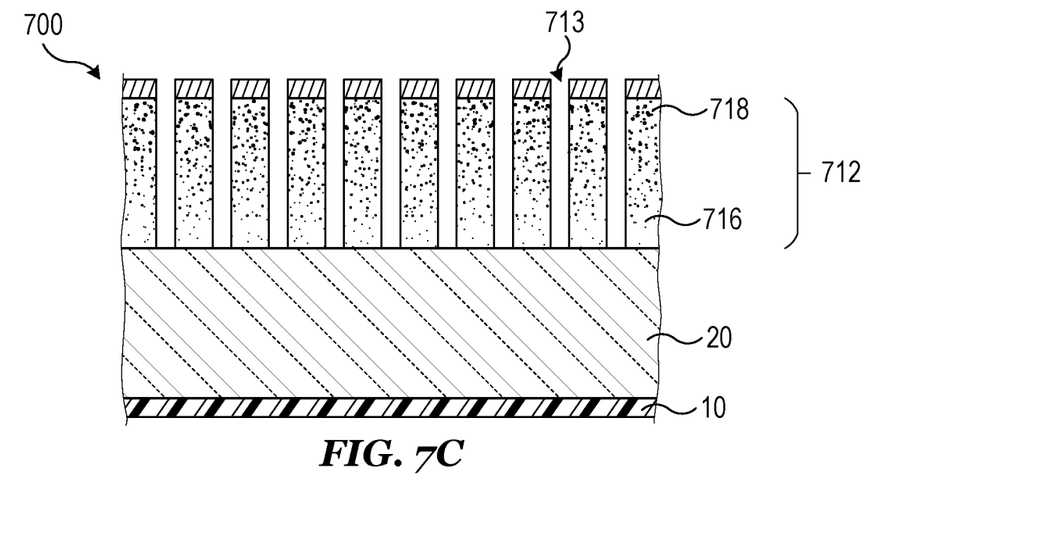

FIGS. 7A-7C illustrate cross-sectional views of an example workpiece during another etching process of an underlying layer using an ACL mask in accordance with embodiments of the invention, where FIG. 7A shows the formation of a soft ACL portion of an ACL, FIG. 7B shows the formation of a hard ACL portion of the ACL, and FIG. 7C shows the formation of the ACL mask. The etching process of FIG. 7A-7C may be combined with other methods and performed using the systems and apparatuses as described herein. For example, the etching process of FIGS. 7A-7C may be combined with any of the embodiments of FIGS. 1A-6F and 8. Similarly labeled elements may be as previously described. Similarly labeled elements may be as previously described.

Referring to FIGS. 7A-7C, a workpiece 700 includes an underlying layer 20 which may be supported by a substrate i. An ACL 714 that includes a soft ACL portion 716 and a hard ACL portion 718 in formed on the underlying layer 20. The etching process of FIGS. 7A-7C is similar to that of FIGS. 6A-6F except a gradient hardness transition is formed by varying process conditions during formation of the ACL 714.

For example, temperature may be varied (e.g. increased) during the deposition process in a controllable way to progressively (e.g. linearly) increase the hardness of the ACL 714 as it is being formed. Other parameters may also be controllably varied during the deposition such as hydrogen concentration (e.g. via precursor composition), bias voltage, and pressure.

In various embodiments, forming the ACL 714 includes varying processing conditions while depositing the ACL 714 to create a hardness gradient transitioning from $H_s$ at the underlying layer 20 to $H_h$ at an upper surface of the ACL 714. In one embodiment, varying the processing conditions while depositing the ACL 714 includes increasing temperature while depositing the ACL. In one embodiment, varying the processing conditions while depositing the ACL 714 includes increasing bias voltage while depositing the ACL 714.

Analogous to FIGS. 6C and 6D, a patterned layer 30 is then formed over the ACL 714 and the ACL 714 is etched to transfer the pattern of the patterned layer 30 to the ACL 714 to form an ACL mask 712 with high aspect ratio features 713 (FIG. 7C).

Figure 8:
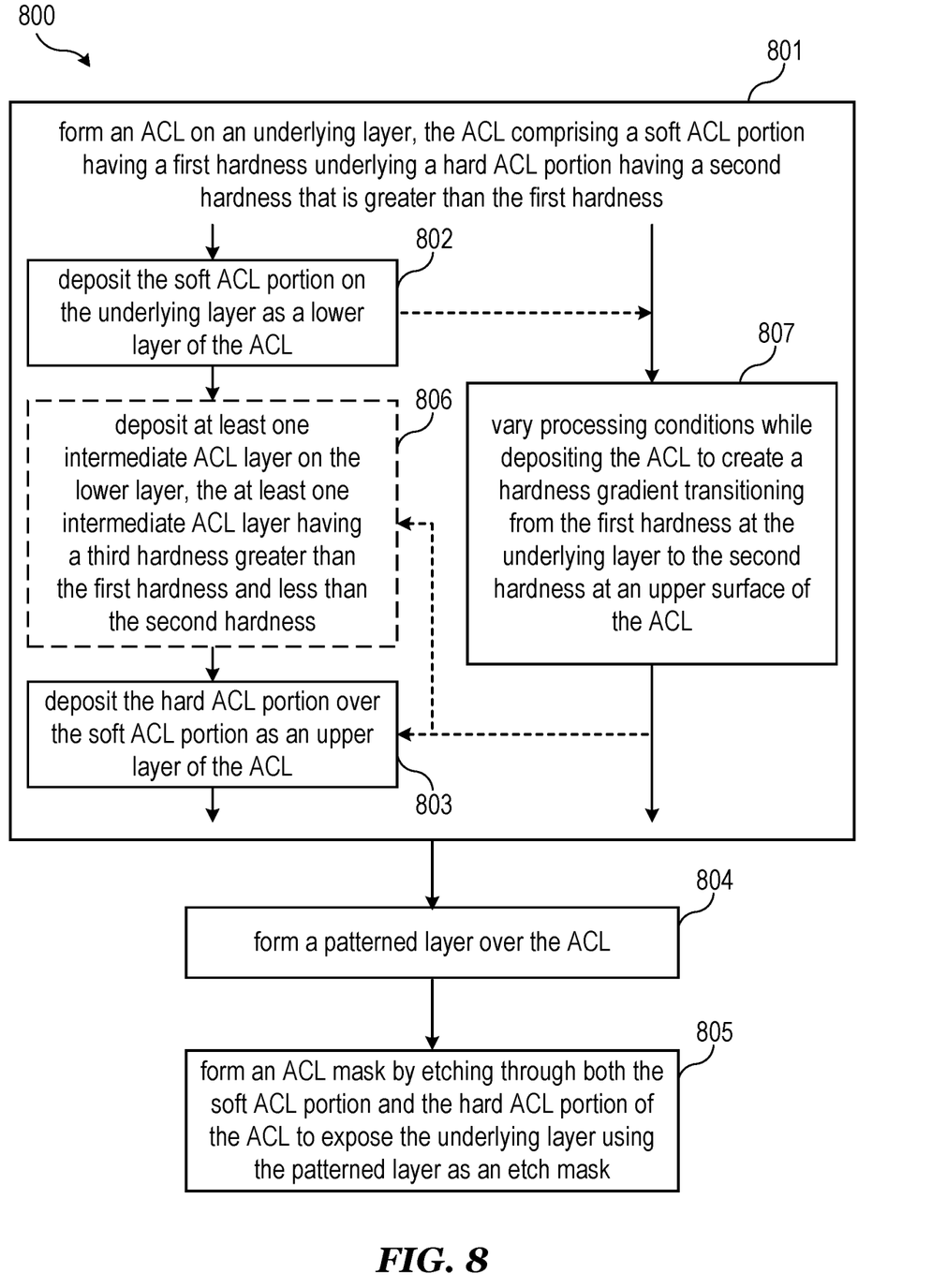
FIG. 8 illustrates a flowchart of an example method of fabricating an ACL mask in accordance with embodiments of the invention.

FIG. 8 illustrates a flowchart of an example method of fabricating an ACL mask in accordance with embodiments of the invention. The method of FIG. 8 may be combined with other methods and performed using the systems and apparatuses as described herein. For example, the method of FIG. 8 may be combined with any of the embodiments of FIGS. 1-7C. Although shown in a logical order, the arrangement and numbering of the steps of FIG. 8 are not intended to be limited. The method steps of FIG. 8 may be performed in any suitable order or concurrently with one another as may be apparent to a person of skill in the art.

Referring to FIG. 8, a method 800 of fabricating an ACL mask includes step 801 of forming an ACL on an underlying layer. The ACL comprises a soft ACL portion having a first hardness underlying a hard ACL portion having a second hardness that is greater than the first hardness. Step 801 may be accomplished in various ways. In step 802, the soft ACL portion may be deposited on the underlying layer as a lower layer of the ACL. The hard ACL portion may be deposited over the soft ACL portion as an upper layer of the ACL as shown in step 803. Optionally, in step 806, at least one intermediate ACL layer may be deposited on the lower layer. The at least one intermediate ACL layer may have a third hardness greater than the first hardness and less than the second hardness.

Additionally or alternatively, step 801 of forming the ACL may be accomplished using step 807 which is to vary processing conditions while depositing the ACL to create a hardness gradient transitioning from the first hardness at the underlying layer to the second hardness at an upper surface of the ACL. As in FIG. 7C, for example, this may be the sole method of forming the ACL. However, as shown using dashed arrows, layers and gradients may also be combined in any suitable configuration depending the specific details of a given application.

After the ACL is formed in step 801, a patterned layer is formed over the ACL in step 804. Step 805 is then to form an ACL mask by etching through both the soft ACL portion and the hard ACL portion of the ACL to expose the underlying layer using the patterned layer as an etch mask. The ACL mask may then be used as an etch mask for the underlying layer as described herein.

Example embodiments of the invention are summarized here. Other embodiments can also be understood from the entirety of the specification as well as the claims filed herein.

Example 1. A method of fabricating an amorphous carbon layer (ACL) mask, the method including: forming an ACL on an underlying layer, the ACL including a soft ACL portion having a first hardness underlying a hard ACL portion having a second hardness that is greater than the first hardness; forming a patterned layer over the ACL; and forming an ACL mask by etching through both the soft ACL portion and the hard ACL portion of the ACL to expose the underlying layer using the patterned layer as an etch mask.

Example 2. The method of example 1, where forming the ACL includes depositing the soft ACL portion on the underlying layer as a lower layer of the ACL, and depositing the hard ACL portion over the soft ACL portion as an upper layer of the ACL.

Example 3. The method of example 2, where forming the ACL further includes depositing an intermediate ACL layer on the lower layer before depositing the hard ACL portion, the intermediate ACL layer having a third hardness greater than the first hardness and less than the second hardness.

Example 4. The method of one of examples 1 to 3, where forming the ACL includes varying processing conditions while depositing the ACL to create a hardness gradient transitioning from the first hardness of the soft ACL portion at the underlying layer to the second hardness of the hard ACL portion at an upper surface of the ACL.

Example 5. The method of example 4, where varying the processing conditions while depositing the ACL includes increasing temperature while depositing the ACL.

Example 6. The method of one of examples 4 and 5, where varying the processing conditions while depositing the ACL includes increasing bias voltage while depositing the ACL.

Example 7. The method of one of examples 1 to 7, where forming the ACL mask includes performing a high aspect ratio carbon etch to etch through both the soft ACL portion and the hard ACL portion.

Example 8. The method of one of examples 1 to 7, where the first hardness is less than 10 GPa, and where the second hardness is greater than or equal to 10 GPa.

Example 9. The method of one of examples 1 to 8, where the soft ACL portion includes an atomic percentage of $sp^3$-bonded carbon that is greater than or equal to 60%, and where the hard ACL portion includes an atomic percentage of $sp^3$-bonded carbon that is greater than about 20% and less than 40%.

Example 10. A method of fabricating an amorphous carbon layer (ACL) mask, the method including: depositing a soft ACL layer of a multilayer ACL stack on an underlying layer, the soft ACL layer having a first hardness less than 10 GPa and a first thickness of at least 0.5 µm, depositing a hard ACL layer of the multilayer ACL stack over the soft ACL layer, the hard ACL layer having a second hardness greater than or equal to 10 GPa; forming a patterned layer over the multilayer ACL stack; and forming an ACL mask by etching through the multilayer ACL stack to expose the underlying layer using the patterned layer as an etch mask.

Example 11. The method of example 10, further including: depositing an intermediate ACL layer on the soft ACL layer before depositing the hard ACL layer, the intermediate ACL layer having a third hardness greater than the first hardness and less than the second hardness.

Example 12. The method of one of examples 10 and 11, where forming the ACL mask includes performing a high aspect ratio carbon etch to etch through the multilayer ACL stack.

Example 13. The method of one of examples 10 to 12, where the soft ACL layer includes an atomic percentage of $sp^3$-bonded carbon that is greater than or equal to 60%, and where the hard ACL layer includes an atomic percentage of $sp^3$-bonded carbon that is greater than about 20% and less than 40%.

Example 14. The method of one of examples 10 to 13, where the first thickness is at least 1 µm, and where the hard ACL layer has a second thickness less than or equal to the first thickness.

Example 15. An amorphous carbon layer (ACL) mask including: a soft ACL layer at least 0.5 µm thick including a first hardness; a hard ACL layer disposed over the soft ACL layer, the hard ACL layer being at least 0.5 µm thick and including a second hardness greater than the first hardness; and a high aspect ratio pattern extending through both the soft ACL layer and the hard ACL layer.

Example 16. The ACL mask of example 15, further including: an intermediate ACL layer disposed on the soft ACL layer and underlying the hard ACL layer, the intermediate ACL layer including a third hardness greater than the first hardness and less than the second hardness.

Example 17. The ACL mask of one of examples 15 and 16, where the first hardness is less than 10 GPa, and where the second hardness is greater than or equal to 10 GPa.

Example 18. The ACL mask of one of examples 15 to 17, where the soft ACL layer includes an atomic percentage of $sp^3$-bonded carbon that is greater than or equal to 60%, and where the hard ACL layer includes an atomic percentage of $sp^3$-bonded carbon that is greater than about 20% and less than 40%.

Example 19. The ACL mask of one of examples 15 to 18, where the soft ACL layer is at least 1 µm thick, and where the hard ACL layer has a thickness less than or equal to 1 µm.

Example 20. The ACL mask of example 19, where the ACL mask is greater than 2 m thick.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an amorphous carbon layer (ACL) mask, the method comprising:

forming an ACL on an underlying layer, the ACL comprising a soft ACL portion having a first hardness less than 10 GPa that is underlying a hard ACL portion having a second hardness greater than or equal to 10 GPa;

forming a patterned layer over the ACL; and forming an ACL mask by etching through both the soft ACL portion and the hard ACL portion of the ACL to expose the underlying layer using the patterned layer as an etch mask.

2. The method of claim 1, wherein forming the ACL comprises
depositing the soft ACL portion on the underlying layer as a lower layer of the ACL, and
depositing the hard ACL portion over the soft ACL portion as an upper layer of the ACL.

3. The method of claim 2, wherein forming the ACL further comprises
depositing an intermediate ACL layer on the lower layer before depositing the hard ACL portion, the intermediate ACL layer having a third hardness greater than the first hardness and less than the second hardness.

4. The method of claim 1, wherein forming the ACL comprises
continuously depositing the ACL beginning with the soft ACL portion at the underlying layer, and
varying processing conditions while continuously depositing the ACL to create a hardness gradient transitioning from the first hardness to the second hardness of the hard ACL portion at an upper surface of the ACL.

5. The method of claim 4, wherein varying the processing conditions while continuously depositing the ACL comprises increasing temperature while depositing the ACL.

6. The method of claim 4, wherein varying the processing conditions while continuously depositing the ACL comprises increasing bias voltage while depositing the ACL.

7. The method of claim 1, wherein forming the ACL mask comprises performing a high aspect ratio carbon etch to etch through both the soft ACL portion and the hard ACL portion.

8. The method of claim 1, wherein the soft ACL portion comprises an atomic percentage of $sp^3$-bonded carbon that is greater than or equal to 60%, and wherein the hard ACL portion comprises an atomic percentage of $sp^3$-bonded carbon that is greater than about 20% and less than 40%.

9. A method of fabricating an amorphous carbon layer (ACL) mask, the method comprising:

depositing a soft ACL layer of a multilayer ACL stack on an underlying layer, the soft ACL layer having a first hardness less than 10 GPa and a first thickness of at least 0.5 µm, depositing a hard ACL layer of the multilayer ACL stack over the soft ACL layer, the hard ACL layer having a second hardness greater than or equal to 10 GPa;

forming a patterned layer over the multilayer ACL stack; and forming an ACL mask by etching through the multilayer ACL stack to expose the underlying layer using the patterned layer as an etch mask.

10. The method of claim 9, further comprising:
depositing an intermediate ACL layer on the soft ACL layer before depositing the hard ACL layer, the intermediate ACL layer having a third hardness greater than the first hardness and less than the second hardness.

11. The method of claim 9, wherein forming the ACL mask comprises performing a high aspect ratio carbon etch to etch through the multilayer ACL stack.

12. The method of claim 9, wherein the soft ACL layer comprises an atomic percentage of $sp^3$-bonded carbon that is greater than or equal to 60%, and wherein the hard ACL layer comprises an atomic percentage of $sp^3$-bonded carbon that is greater than about 20% and less than 40%.

13. The method of claim 9, wherein the first thickness is at least 1 μm, and wherein the hard ACL layer has a second thickness less than or equal to the first thickness.

14. A method of fabricating an amorphous carbon layer (ACL) mask, the method comprising:
- forming an ACL on an underlying layer, the ACL comprising a soft ACL portion having a first hardness underlying a hard ACL portion having a second hardness greater than the first hardness, wherein forming the ACL comprises
  - continuously depositing the ACL beginning with the soft ACL portion at the underlying layer, and
  - varying processing conditions while continuously depositing the ACL to create a hardness gradient transitioning from the first hardness to the second hardness of the hard ACL portion at an upper surface of the ACL;
- forming a patterned layer over the ACL; and
- forming an ACL mask by etching through both the soft ACL portion and the hard ACL portion of the ACL to expose the underlying layer using the patterned layer as an etch mask.

15. The method of claim 14, wherein varying the processing conditions while continuously depositing the ACL comprises increasing temperature while depositing the ACL.

16. The method of claim 14, wherein varying the processing conditions while continuously depositing the ACL comprises increasing bias voltage while depositing the ACL.

17. The method of claim 14,
- wherein varying the processing conditions while continuously depositing the ACL comprises increasing temperature while depositing the ACL or increasing bias voltage while depositing the ACL, and
- wherein the first hardness is less than 10 GPa, and wherein the second hardness is greater than or equal to 10 GPa.

18. The method of claim 14, wherein forming the ACL mask comprises performing a high aspect ratio carbon etch to etch through both the soft ACL portion and the hard ACL portion.

19. The method of claim 14, wherein the soft ACL portion comprises an atomic percentage of $sp^3$-bonded carbon that is greater than or equal to 60%, and wherein the hard ACL portion comprises an atomic percentage of $sp^3$-bonded carbon that is greater than about 20% and less than 40%.

20. The method of claim 14, wherein an overall thickness of the ACL is greater than about 1.5 μm.

* * * * *